United States Patent
Liang

(10) Patent No.: US 9,013,883 B2
(45) Date of Patent: Apr. 21, 2015

(54) GUIDING MECHANISM FOR GUIDING FLEXIBLE PRINTED CIRCUIT BOARD CONNECTED WITH DISPLAY MODULE AND HOST MODULE AND PORTABLE ELECTRONIC DEVICE THEREWITH

(71) Applicant: Wistron Corporation, New Taipei (TW)

(72) Inventor: Chen-Yi Liang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 260 days.

(21) Appl. No.: 13/861,389

(22) Filed: Apr. 12, 2013

(65) Prior Publication Data

US 2013/0335926 A1  Dec. 19, 2013

(30) Foreign Application Priority Data

Jun. 15, 2012  (TW) .............................. 101121546 A

(51) Int. Cl.
| | |
|---|---|
| H05K 1/14 | (2006.01) |
| H05K 5/00 | (2006.01) |
| H05K 7/14 | (2006.01) |
| G06F 1/16 | (2006.01) |
| H04M 1/02 | (2006.01) |
| G06F 1/18 | (2006.01) |

(52) U.S. Cl.
CPC ............ *H05K 7/1418* (2013.01); *G06F 1/1624* (2013.01); *H04M 1/0214* (2013.01); *H04M 1/0235* (2013.01); *H04M 1/0277* (2013.01); *G06F 1/1616* (2013.01); *G06F 1/1681* (2013.01); *G06F 1/189* (2013.01)

(58) Field of Classification Search
CPC . H05K 7/1418; H05K 7/1425; H05K 7/1409; H05K 7/1429; H05K 7/1424; G06F 1/185; G06F 1/186; G06F 1/184; G02B 6/4201; G06K 7/0047; G06K 13/08
See application file for complete search history.

(56) References Cited

U.S. PATENT DOCUMENTS

| | | | | |
|---|---|---|---|---|
| 8,564,945 | B2 * | 10/2013 | Nakao et al. ................ | 361/679.3 |
| 2005/0215298 | A1 * | 9/2005 | Lee ............................. | 455/575.4 |
| 2006/0068859 | A1 * | 3/2006 | Lee et al. .................... | 455/575.4 |
| 2007/0155451 | A1 * | 7/2007 | Lee ............................. | 455/575.4 |
| 2007/0275774 | A1 * | 11/2007 | Fagrenius et al. .......... | 455/575.4 |
| 2008/0132302 | A1 * | 6/2008 | Schechtel et al. .......... | 455/575.4 |
| 2009/0093285 | A1 * | 4/2009 | Weng et al. ................. | 455/575.4 |
| 2009/0149230 | A1 * | 6/2009 | Ruan .......................... | 455/575.4 |
| 2011/0136554 | A1 * | 6/2011 | Wong et al. ................ | 455/575.4 |
| 2011/0143823 | A1 * | 6/2011 | Holman et al. ............ | 455/575.4 |

* cited by examiner

*Primary Examiner* — Hoa C Nguyen
*Assistant Examiner* — Xanthia C Cunningham
(74) *Attorney, Agent, or Firm* — Winston Hsu; Scott Margo

(57) ABSTRACT

A guiding mechanism includes a first guiding component, a second guiding component, a push rod, a push rod sheath and a driving component. A distance is between the second guiding component and the first guiding component and increases in a first direction. The push rod includes a rod base slidably connected to the first guiding component. The push rod sheath includes an engaging portion movably engaged with the rod base, and a guiding portion slidably connected to the second guiding component and used for pushing a flexible printed circuit board. The driving component drives the rod base to move relative to the engaging portion, so as to drive the push rod and the push rod sheath to slide relative to the first guiding component and the second guiding component.

37 Claims, 16 Drawing Sheets

GUIDING MECHANISM FOR GUIDING FLEXIBLE PRINTED CIRCUIT BOARD CONNECTED WITH DISPLAY MODULE AND HOST MODULE AND PORTABLE ELECTRONIC DEVICE THEREWITH

BACKGROUND OF THE INVENTION

1. Field of the Invention

The invention relates to a guiding mechanism and a portable electronic device and, more particularly, to a guiding mechanism for guiding a flexible printed circuit board connected with a display module and a host module and a portable electronic device therewith.

2. Description of the Prior Art

Flexible printed circuit board (FPC) can be applied to various electronic devices due to its flexibility. Therefore, FPC is a necessary component while electronic devices tend to light, thin, short, small and multi-function design. So far lots of sliding-type electronic devices have been developed, such as sliding-type flat computer, sliding-type mobile phone and so on. The sliding-type electronic device utilizes an FPC to connect a display device, which can move with respect to a base, and a main circuit board, which disposed in the base. When the display device moves with respect to the base, the display device will drives the FPC to move. After a user opens or closes the display device with respect to the base repeatedly, the FPC may crack due to compression and extrusion.

SUMMARY OF THE INVENTION

The invention provides a guiding mechanism for guiding a flexible printed circuit board connected with a display module and a host module and a portable electronic device therewith, so as to solve the aforesaid problems.

According to the claimed invention, a guiding mechanism for guiding a flexible printed circuit board connected with a display module and a host module comprises a first guiding component, a second guiding component, a push rod, a push rod sheath and a driving component. A distance is between the second guiding component and the first guiding component and increases in a first direction. The push rod is disposed between the first guiding component and the second guiding component, and the push rod comprises a rod base slidably connected to the first guiding component. The push rod sheath is disposed between the first guiding component and the second guiding component, the push rod sheath comprises an engaging portion movably engaged with the rod base; and a guiding portion, an end of the guiding portion being connected to the engaging portion, another end of the guiding portion being slidably connected to the second guiding component, the guiding portion being used for pushing the flexible printed circuit board. The driving component is disposed in the guiding portion of the push rod sheath, the driving component drives the rod base of the push rod to move relative to the engaging portion of the push rod sheath when the display module slides relative to the host module, so as to drive the push rod and the push rod sheath to slide relative to the first guiding component and the second guiding component such that the guiding portion of the push rod sheath pushes the flexible printed circuit board to move.

According to the claimed invention, the first guiding component and the second guiding component are guiding rods, the guiding mechanism further comprises two first fixing structures and two second fixing structures, the two first fixing structures are used for fixing an end of the first guiding component and an end of the second guiding component, the two second fixing structures are used for fixing another end of the first guiding component and another end of the second guiding component.

According to the claimed invention, each of the first fixing structures is a fixing base, each of the second fixing structures comprises a hook component for engaging the another end of the first guiding component and the another end of the second guiding component.

According to the claimed invention, each of the second fixing structures comprises a fixing pillar, a washer and a fixing member, the washer is disposed on the fixing pillar, the fixing member passes through the washer and is fixed on the fixing pillar such that the washer presses down the another end of the first guiding component and the another end of the second guiding component.

According to the claimed invention, an end of the rod base and an end of the guiding portion have axial holes formed thereon, the rod base and the guiding portion are sleeved on the first guiding component and the second guiding component through the axial holes.

According to the claimed invention, the end of the rod base has at least one hook, the engaging portion has at least one engaging groove formed thereon, the at least one hook is movably engaged with the at least one engaging groove.

According to the claimed invention, a side of the guiding portion has a curved structure formed thereon and abutting against the flexible printed circuit board.

According to the claimed invention, the push rod further comprises a rod body, an end of the push rod is connected to the rod body, another end of the push rod is slidably connected to the first guiding component, the driving component is a resilient component sleeved on the rod body of the push rod.

According to the claimed invention, the guiding portion has a rod body groove and a resilient component groove formed therein, the rod body groove and the resilient component groove communicate with each other and are used for accommodating the rod body of the push rod and the resilient component.

According to the claimed invention, the resilient component is a compression spring, the compression spring deforms when the display module slides relative to the host module in a reverse direction of the first direction and provides an elastic force for the rod base of the push rod when the display module slides relative to the host module in the first direction, so as to push the rod base of the push rod to move relative to the engaging portion of the push rod sheath in a second direction, the first direction is substantially perpendicular to the second direction.

According to the claimed invention, the resilient component pushes the rod base of the push rod to move relative to the engaging portion of the push rod sheath in the second direction, so as to drive the push rod and the push rod sheath to slide relative to the first guiding component and the second guiding component in the first direction such that the guiding portion of the push rod sheath pushes the flexible printed circuit board to move.

According to the claimed invention, when the display module slides relative to the host module in the reverse direction of the first direction, the flexible printed circuit board pulls the guiding portion of the push rod sheath to move in the reverse direction of the first direction.

According to the claimed invention, the resilient component is an extension spring, the extension spring deforms when the display module slides relative to the host module in the first direction and provides an elastic force for the rod base of the push rod when the display module slides relative to the host module in a reverse direction of the first direction, so as to pull the rod base of the push rod to move relative to the engaging portion of the push rod sheath in a second direction, the first direction is substantially perpendicular to the second direction.

According to the claimed invention, the resilient component pulls the rod base of the push rod to move relative to the engaging portion of the push rod sheath in the second direction, so as to drive the push rod and the push rod sheath to slide relative to the first guiding component and the second guiding component in the reverse direction of the first direction such that the guiding portion of the push rod sheath pushes the flexible printed circuit board to move.

According to the claimed invention, when the display module slides relative to the host module in the first direction, the flexible printed circuit board pulls the guiding portion of the push rod sheath to move in the first direction.

According to the claimed invention, the driving component comprises two magnetic units disposed on the push rod and the push rod sheath, the two magnetic units repel each other when the display module slides relative to the host module in the first direction, so as to push the rod base of the push rod to move relative to the engaging portion of the push rod sheath in a second direction, the first direction is substantially perpendicular to the second direction.

According to the claimed invention, the two magnetic units drives the rod base of the push rod to move relative to the engaging portion of the push rod sheath in the second direction, so as to drive the push rod and the push rod sheath to slide relative to the first guiding component and the second guiding component in the first direction such that the guiding portion of the push rod sheath pushes the flexible printed circuit board to move.

According to the claimed invention, the driving component comprises two magnetic units disposed on the push rod and the push rod sheath, the two magnetic units attract each other when the display module slides relative to the host module in a reverse direction of the first direction, so as to pull the rod base of the push rod to move relative to the engaging portion of the push rod sheath in a second direction, the first direction is substantially perpendicular to the second direction.

According to the claimed invention, the two magnetic units drives the rod base of the push rod to move relative to the engaging portion of the push rod sheath in the second direction, so as to drive the push rod and the push rod sheath to slide relative to the first guiding component and the second guiding component in the reverse direction of the first direction such that the guiding portion of the push rod sheath pushes the flexible printed circuit board to move.

According to the claimed invention, the first guiding component or the second guiding component is a guiding track, an engaging groove corresponding to the guiding track is formed on an end of the rod base or an end of the guiding portion, the engaging groove is slidably engaged with the guiding track.

According to the claimed invention, the first guiding component or the second guiding component is a guiding rod, a roller corresponding to the guiding rod is disposed on an end of the rod base or an end of the guiding portion, the roller is rotatably connected to the guiding rod.

According to the claimed invention, a portable electronic device comprises a host module, a display module, a flexible printed circuit board and a guiding mechanism. The display module is slidably disposed on a side of the host module. The flexible printed circuit board is connected with the host module and the display module. The guiding mechanism is used for guiding the flexible printed circuit board, and the guiding mechanism comprises a first guiding component, a second guiding component, a push rod, a push rod sheath and a driving component. A distance is between the second guiding component and the first guiding component and increases in a first direction. The push rod is disposed between the first guiding component and the second guiding component, and the push rod comprises a rod base slidably connected to the first guiding component. The push rod sheath is disposed between the first guiding component and the second guiding component, the push rod sheath comprises an engaging portion movably engaged with the rod base; and a guiding portion, an end of the guiding portion being connected to the engaging portion, another end of the guiding portion being slidably connected to the second guiding component, the guiding portion being used for pushing the flexible printed circuit board. The driving component is disposed in the guiding portion of the push rod sheath, the driving component drives the rod base of the push rod to move relative to the engaging portion of the push rod sheath when the display module slides relative to the host module, so as to drive the push rod and the push rod sheath to slide relative to the first guiding component and the second guiding component such that the guiding portion of the push rod sheath pushes the flexible printed circuit board to move.

The guiding mechanism of the invention can guide the flexible printed circuit board smoothly. Therefore, when the display module slides or rotates relative to the host module repeatedly, the flexible printed circuit board will not crack due to compression and extrusion such that the stability of the flexible printed circuit board can be improved effectively.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part hereof, and in which is shown by way of illustration specific embodiments in which the invention maybe practiced. In this regard, directional terminology, such as "top," "bottom," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "installed" and variations thereof herein are used broadly and encompass direct and indirect connections and installations. Accordingly, the drawings and descriptions will be regarded as illustrative in nature and not as restrictive.

Figure 1:
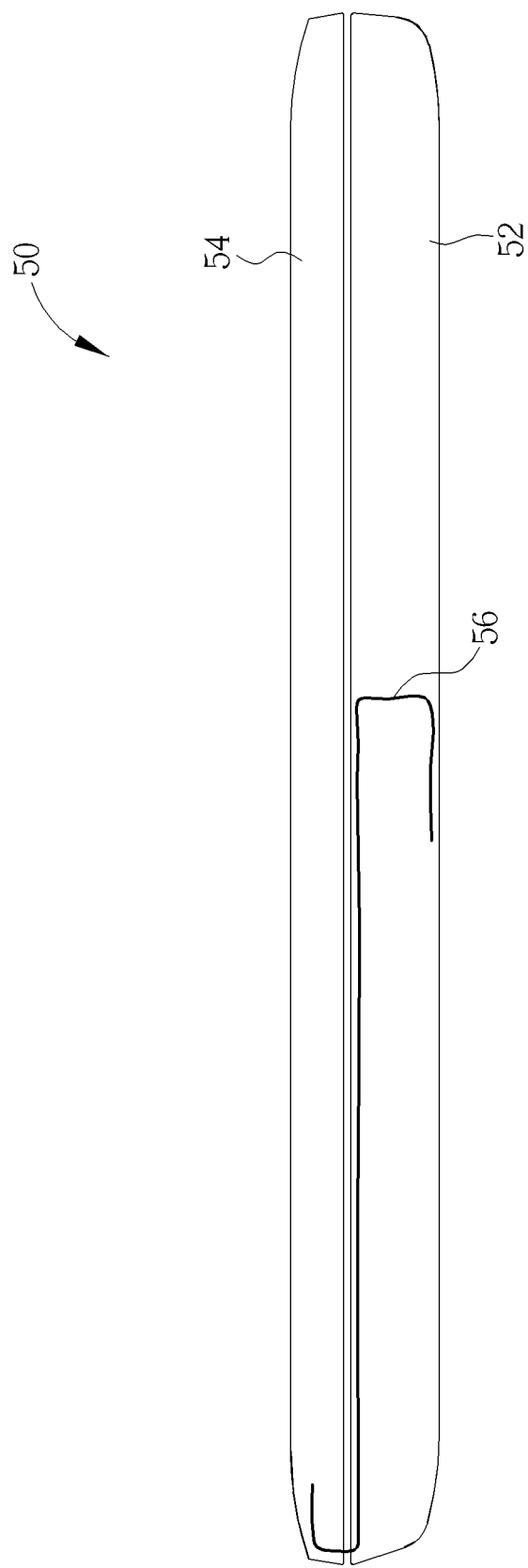
FIGS. 1 to 3 are schematic diagrams illustrating a portable electronic device under different operation states according to an embodiment of the invention.
Figure 2:
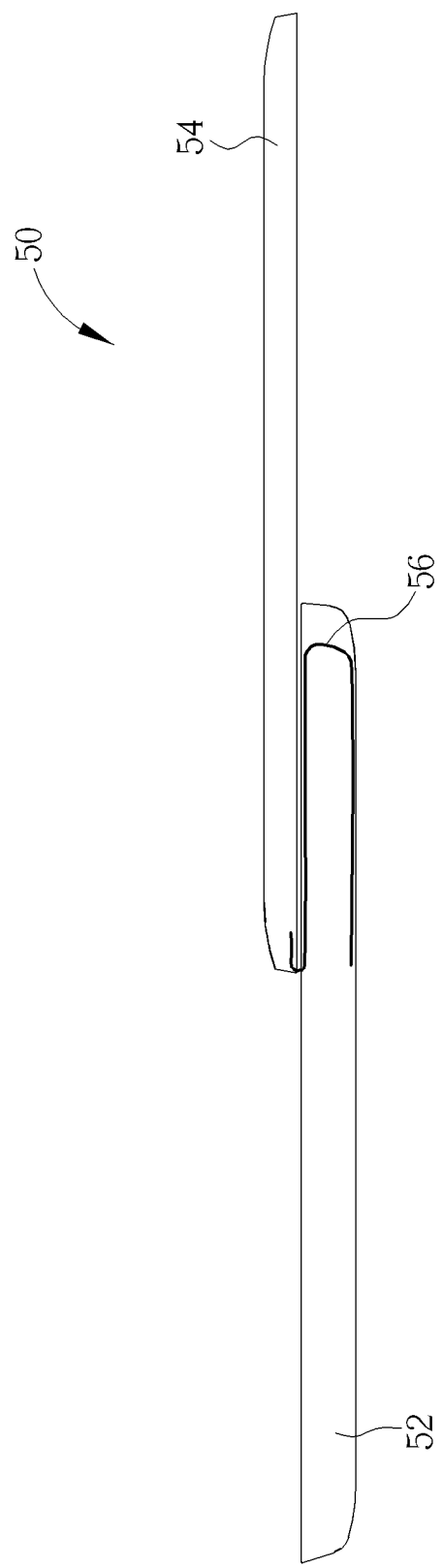
Figure 3:
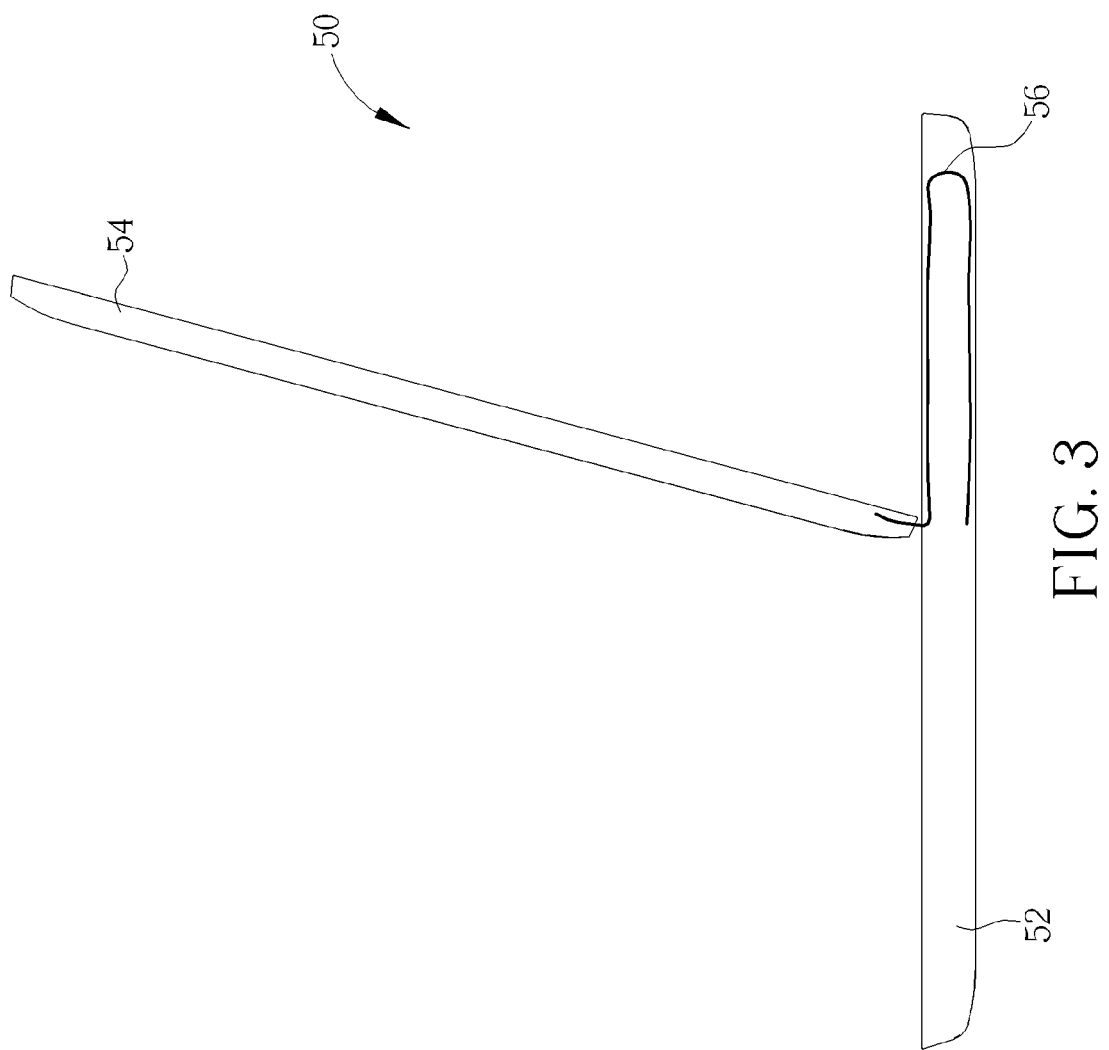

Referring to FIGS. 1 to 3, FIGS. 1 to 3 are schematic diagrams illustrating a portable electronic device 50 under different operation states according to an embodiment of the invention. The portable electronic device 50 may be a portable electronic device with two modes of notebook and flat computer. The portable electronic device 50 comprises a host module 52, which may be a computer host module and equipped with an input interface, such as a keyboard and so on. The portable electronic device 50 further comprises a display module 54 slidably and rotatably disposed on a side of the host module 52. The display module 54 may be a touch display monitor such that a user can perform touch operation through the display module 54. The portable electronic device 50 further comprises a flexible printed circuit board 56 flexibly connected with the host module 52 and the display module 54 and used for transmitting signals between the host module 52 and the display module 54. Furthermore, although this embodiment utilizes the flexible printed circuit board 56 to connect the host module 52 and the display module 54 and transmit signals between the two modules, the flexible printed circuit board 56 may be replaced by a cable or a set of flexible distribution lines based on practical applications. As shown in FIG. 1, the host module 52 and the display module 54 are closed with each other such that a user can carry the portable electronic device 50 easily. As shown in FIG. 2, the display module 54 slides horizontally relative to the host module 52 to the end. Then, as shown in FIG. 3, the display module 54 can be rotated upwardly relative to the host module 52 so as to provide a preferred viewing angle for the user.

Figure 4:
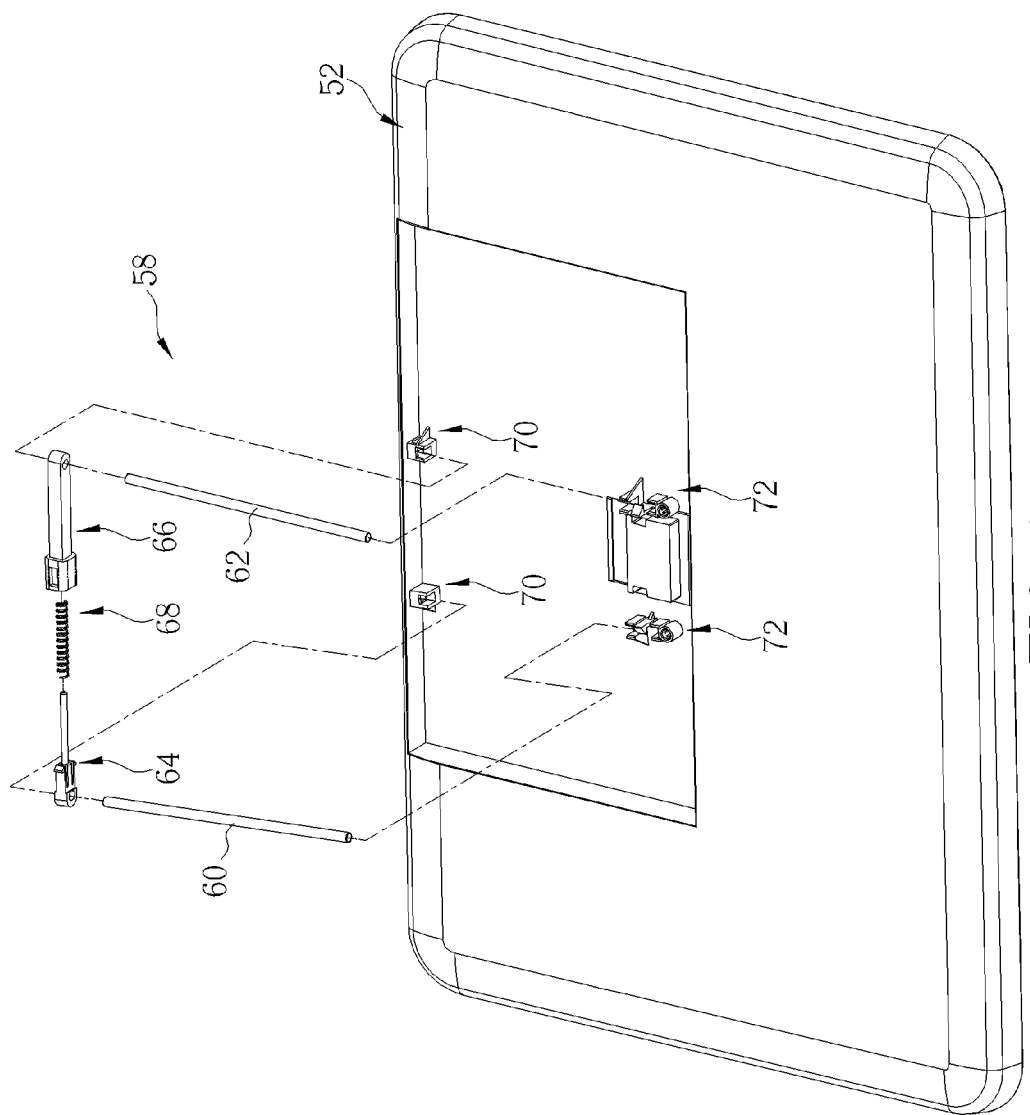
FIGS. 4 and 5 are exploded view and assembly view illustrating a guiding mechanism for guiding the flexible printed circuit board connected with the display module and the host module according to an embodiment of the invention.
Figure 5:
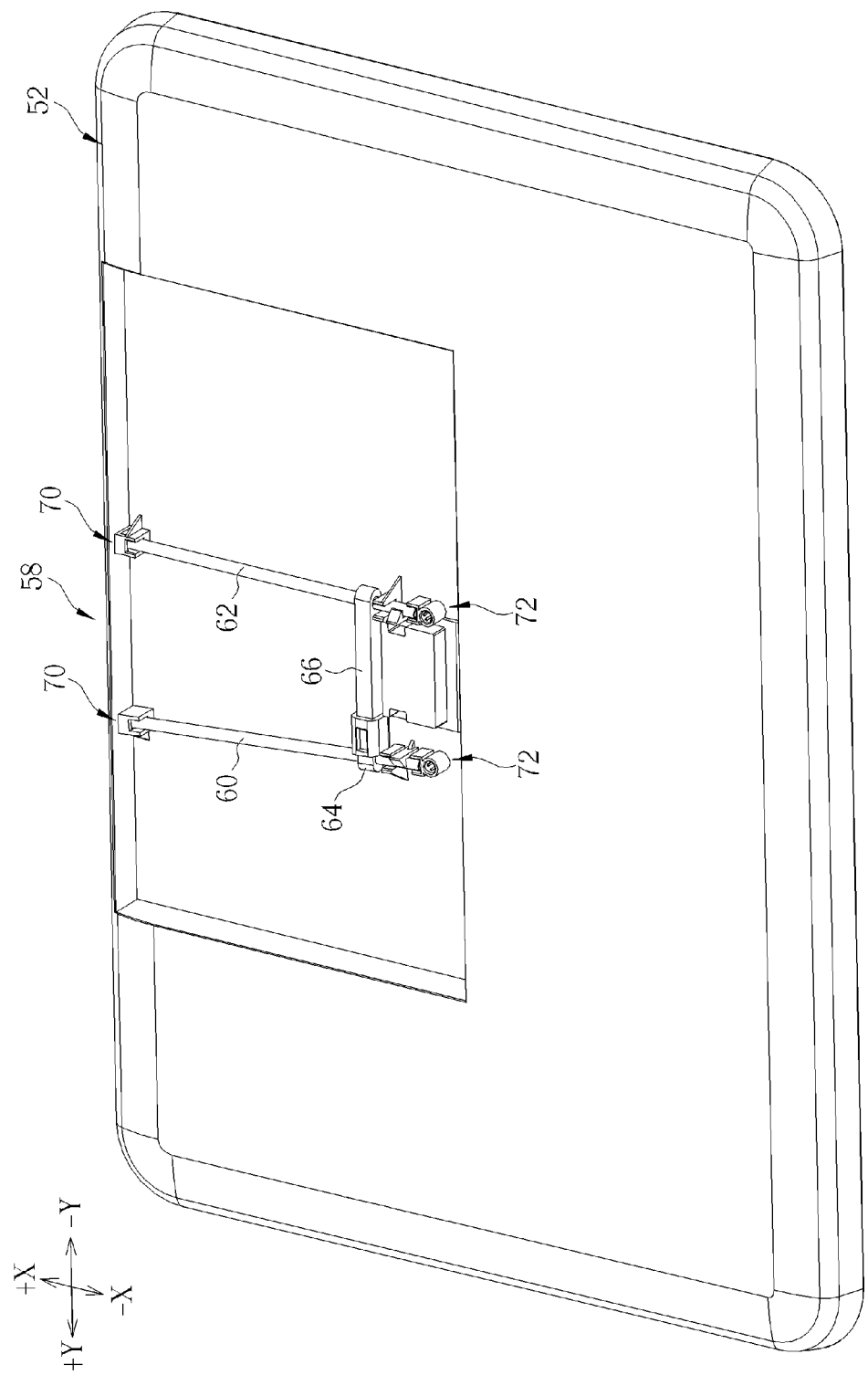
Figure 6:
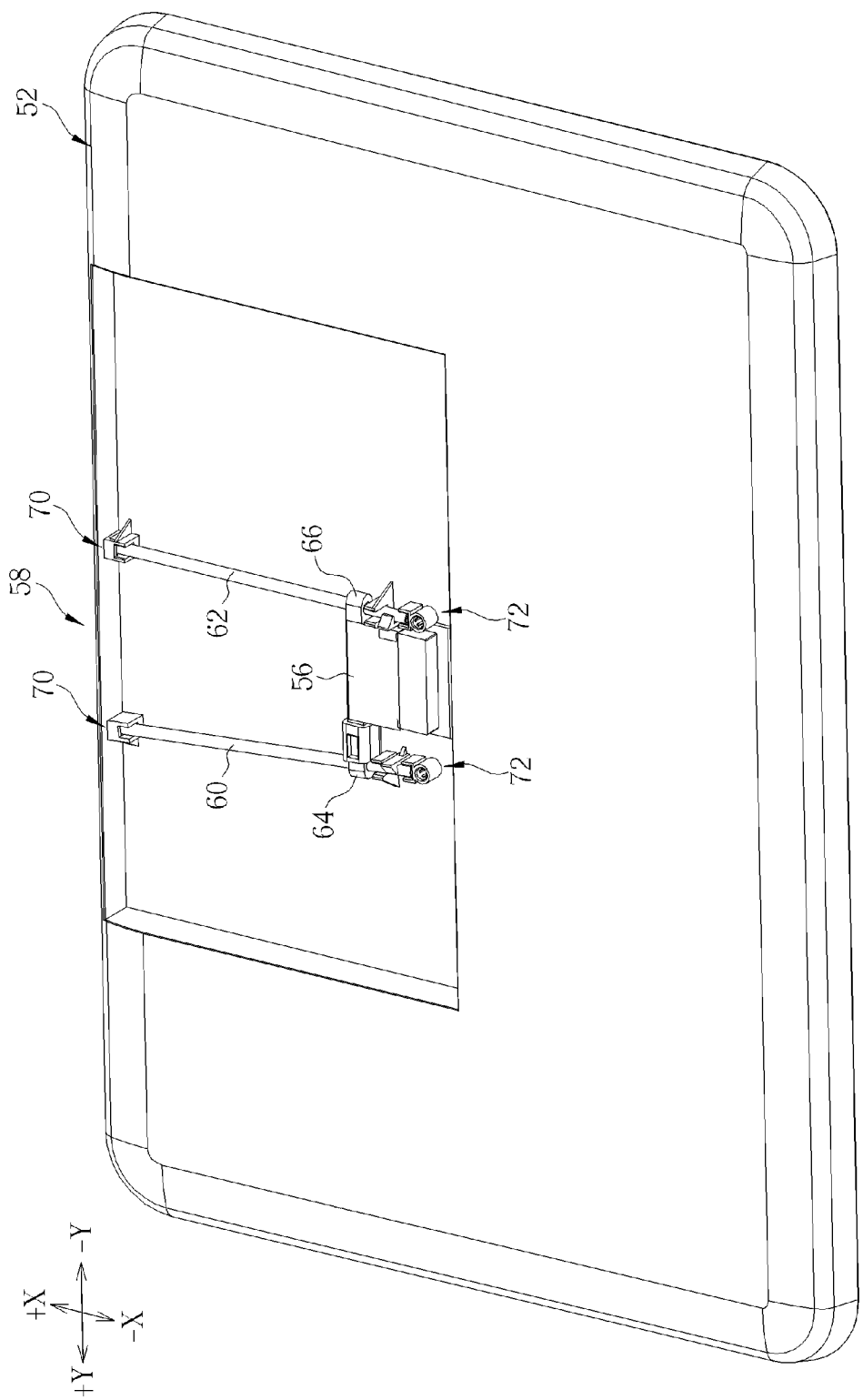
FIGS. 6 to 8 are schematic diagrams illustrating the flexible printed circuit board and the guiding mechanism located at different positions corresponding to FIGS. 1 to 3 according to an embodiment of the invention.
Figure 7:
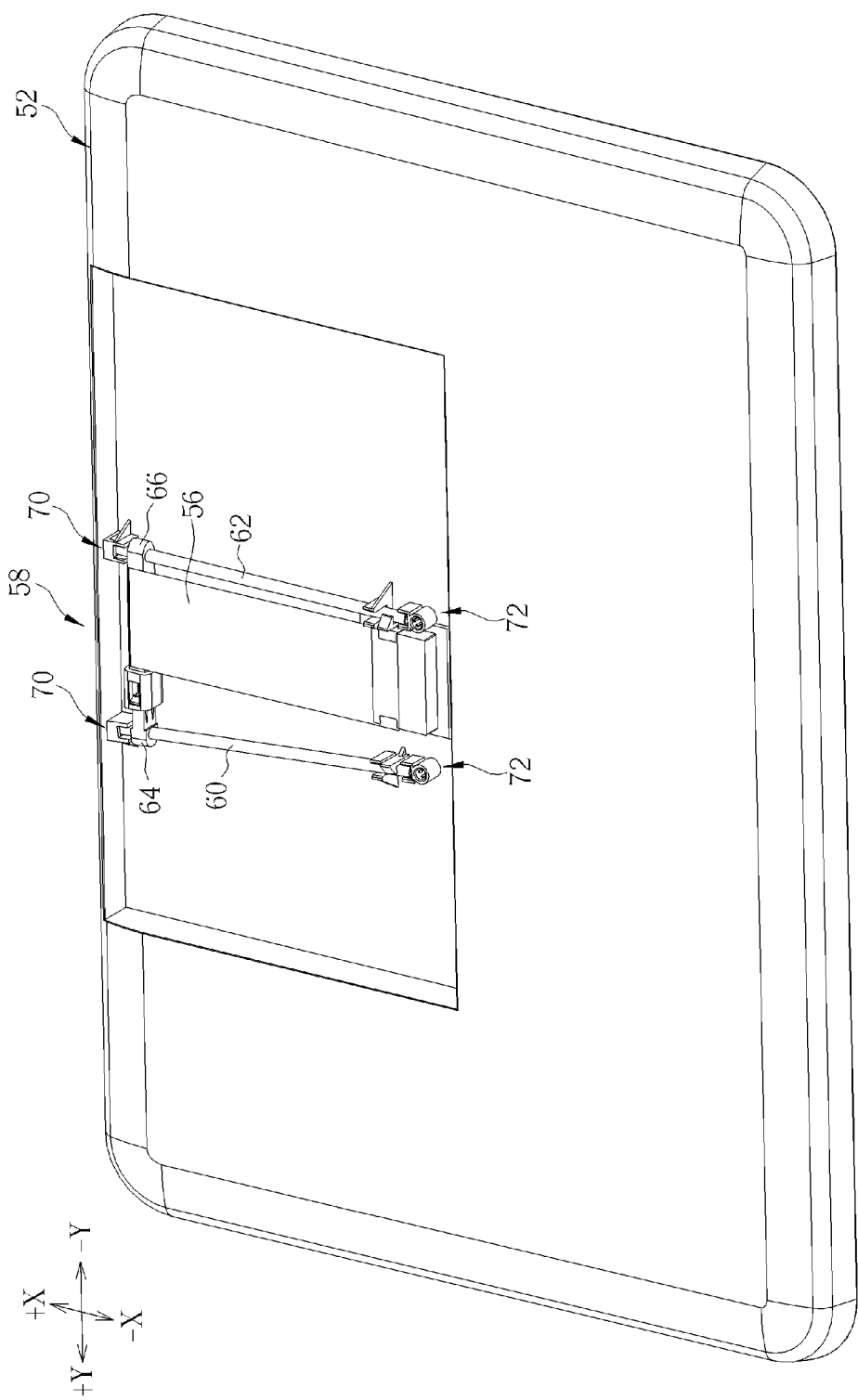
Figure 8:
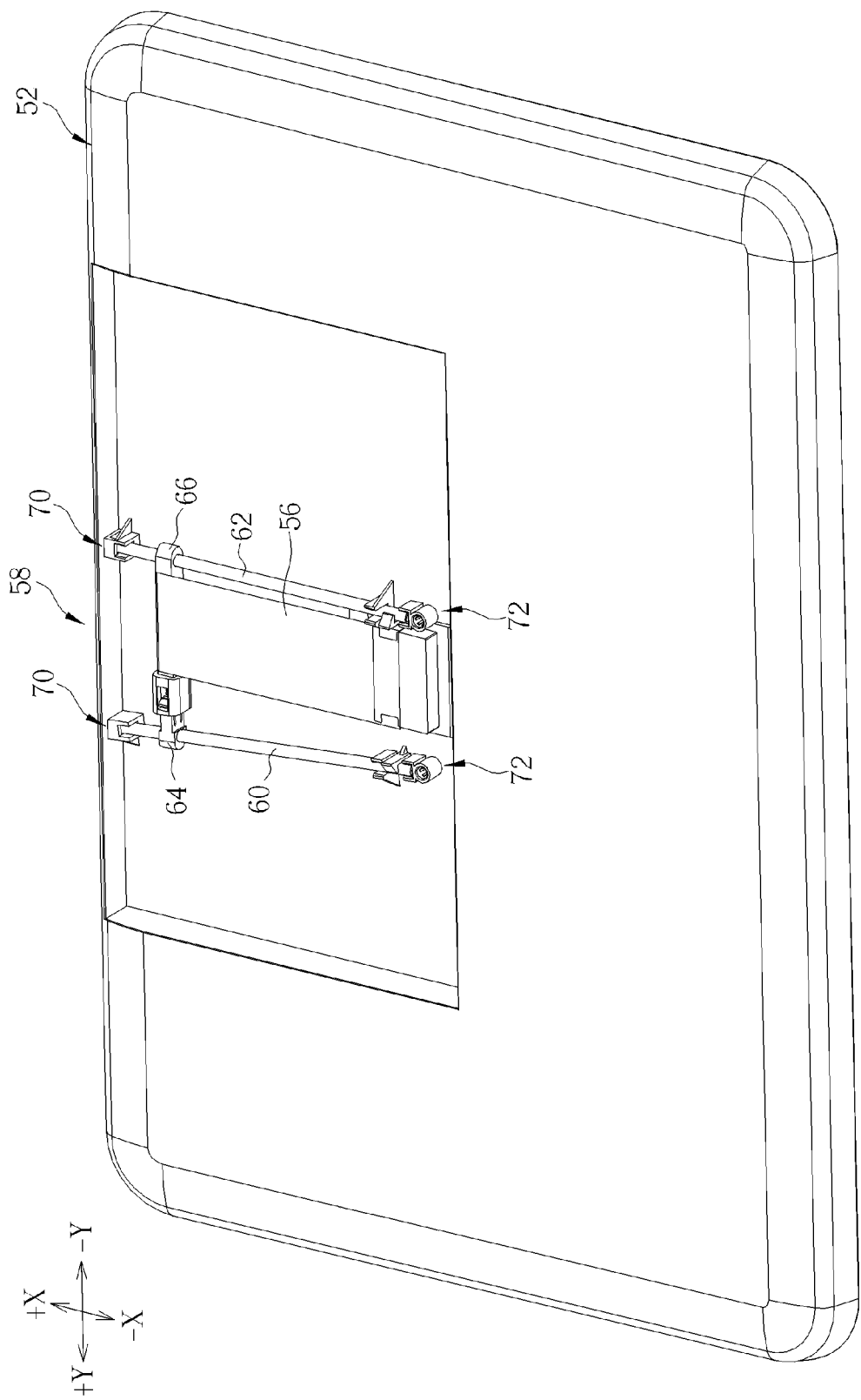
Figure 9:
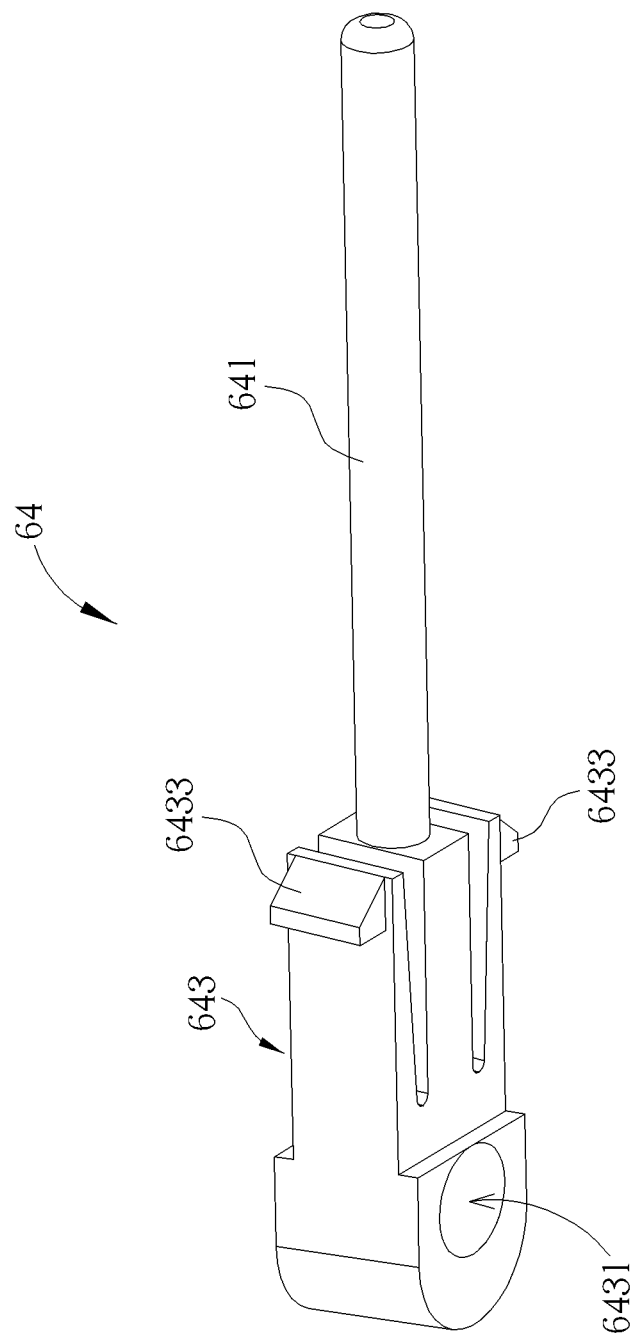
FIG. 9 is a schematic diagram illustrating the push rod.

Referring to FIGS. 4 to 8, FIGS. 4 and 5 are exploded view and assembly view illustrating a guiding mechanism 58 for guiding the flexible printed circuit board 56 connected with the display module 54 and the host module 52 according to an embodiment of the invention, and FIGS. 6 to 8 are schematic diagrams illustrating the flexible printed circuit board 56 and the guiding mechanism 58 located at different positions corresponding to FIGS. 1 to 3 according to an embodiment of the invention. The guiding mechanism 58 may be disposed in the host module 52 and used for guiding the flexible printed circuit board 56, such that the flexible printed circuit board 56 will not crack due to compression and extrusion when the display module 54 slides or rotates relative to the host module 52. The guiding mechanism 58 comprises a first guiding component 60, a second guiding component 62, a push rod 64, a push rod sheath 66 and a driving component 68. The first guiding component 60 and the second guiding component 62 may be guiding rods. A distance is between the first guiding component 60 and the second guiding component 62 and increases in a first direction (e.g. the direction +X). The push rod 64 is disposed between the first guiding component 60 and the second guiding component 62. Referring to FIG. 9, FIG. 9 is a schematic diagram illustrating the push rod 64. The push rod 64 comprises a rod body 641 and a rod base 643. An end of the rod base 643 is connected to the rod body 641 and another end of the rod base 643 is slidably connected to the first guiding component 60. For example, an axial hole 6431 may be formed on the another end of the rod base 643 such that the rod base 643 may be slidably sleeved on the first guiding component 60 through the axial hole 6431. At least one hook 6433 may be disposed on the end of the rod base 643. In this embodiment, there are two hooks 6433 disposed on the end of the rod base 643, wherein the two hooks 6433 are formed at opposite sides of the end of the rod base 643.

Figure 10:
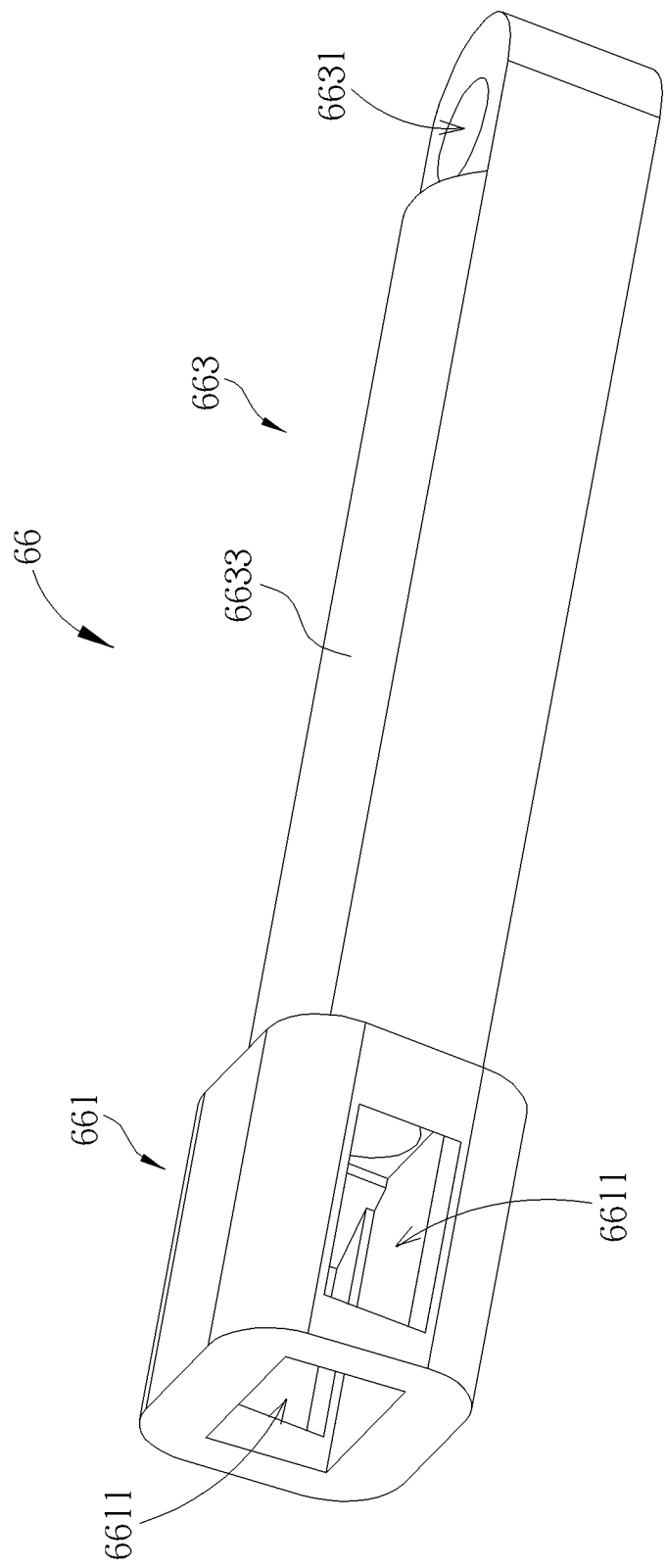
FIGS. 10 and 11 are schematic diagram and cross-sectional view illustrating the push rod sheath.
Figure 11:
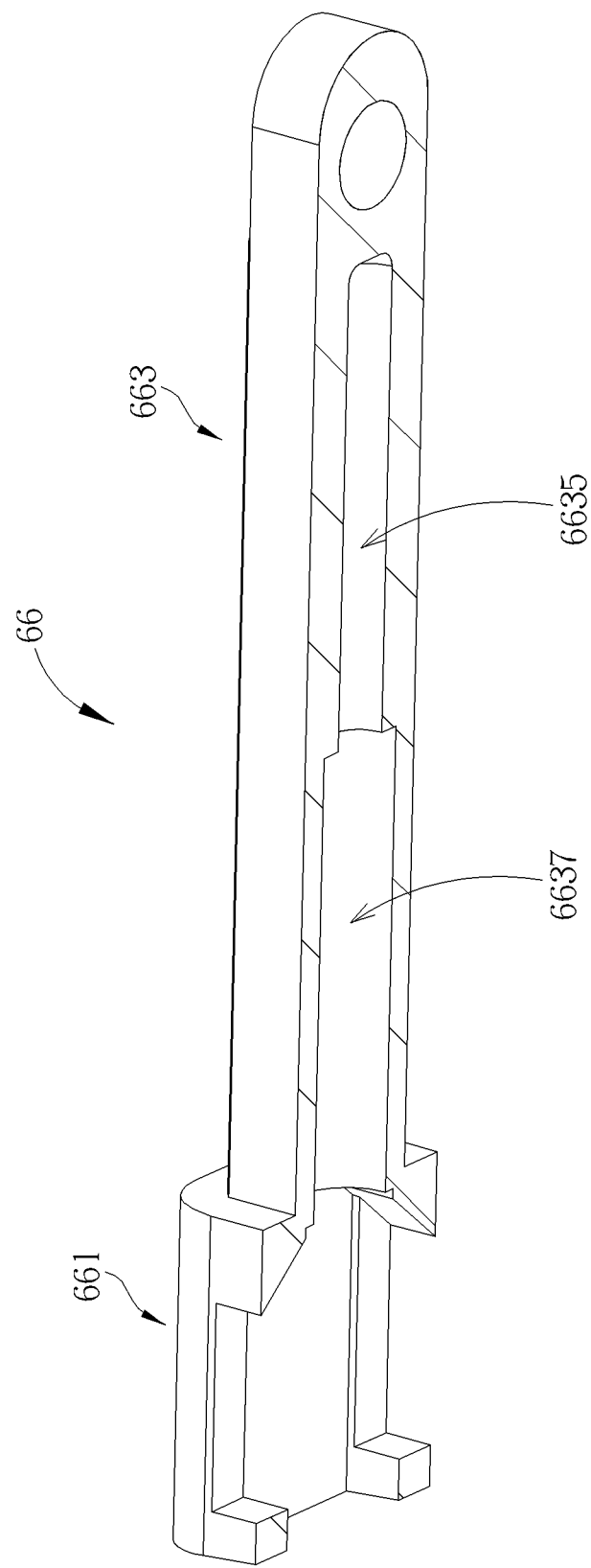

Furthermore, the push rod sheath 66 is disposed between the first guiding component 60 and the second guiding component 62 and connected to the push rod 64. Referring to FIGS. 10 and 11, FIGS. 10 and 11 are schematic diagram and cross-sectional view illustrating the push rod sheath 66. The push rod sheath 66 comprises an engaging portion 661 and a guiding portion 663. The engaging portion 661 is movably engaged with the rod base 643 of the push rod 64. For example, at least one engaging groove 6611 may be formed on the engaging portion 661 and the hook 6433 of the rod base 643 is movably engaged with the engaging groove 6611. In this embodiment, there are two engaging grooves 6611 formed at opposite sides of the engaging portion 661 so as to be connected to the two hooks 6433 of the rod base 643 correspondingly. The position and number of the engaging grooves 6611 and the hooks are not limited to this embodiment and can be determined based on practical applications. An end of the guiding portion 663 is connected to the engaging portion 661 and another end of the guiding portion 663 is slidably connected to the second guiding component 62. For example, an axial hole 6631 may be formed on the another end of the guiding portion 663 such that the guiding portion 663 may be slidably sleeved on the second guiding component 62 through the axial hole 6631. The guiding portion 663 is used for accommodating the rod body 641 of the push rod 64. The guiding portion 663 may be used for pushing the flexible printed circuit board 56 to move or being driven by the flexible printed circuit board 56 to move. A side of the guiding portion 663 may have a curved structure 6633 formed thereon and abutting against the flexible printed circuit board 56, such that the guiding portion 663 can contact the flexible printed circuit board 56 more tightly and then push the flexible printed circuit board 56 to move smoothly, so as to prevent the flexible printed circuit board 56 from being bended. Furthermore, a sleeve component may be sleeved on the guiding portion 663 of the push rod sheath 66 based on practical applications, so as to reduce friction between the guiding portion 663 and the flexible printed circuit board 56. Moreover, a rod body groove 6635 and a resilient component groove 6637 are formed in the guiding portion 663, wherein the rod body groove 6635 and the resilient component groove 6637 communicate with each other and are used for accommodating the rod body 641 of the push rod 64 and the driving component 68. Still further, in this embodiment, the driving component 68 may be a resilient component, the driving component 68 is sleeved on the rod body 641 of the push rod 64, an end of the driving component 68 abuts against the rod base 643 of the push rod 64, and the driving component 68 is disposed in the guiding portion 663 of the push rod sheath 66 (i.e. the driving component 68 is disposed in the resilient component groove 6637 of the guiding portion 663). The driving component 68 drives the rod base 643 of the push rod 64 to move relative to the engaging portion 661 of the push rod sheath 66 when the display module 54 slides relative to the host module 52, so as to drive the push rod 64 and the push rod sheath 66 to slide relative to the first guiding component 60 and the second guiding component 62 such that the guiding portion 663 of the push rod sheath 66 pushes the flexible printed circuit board 56 to move.

Figure 12:
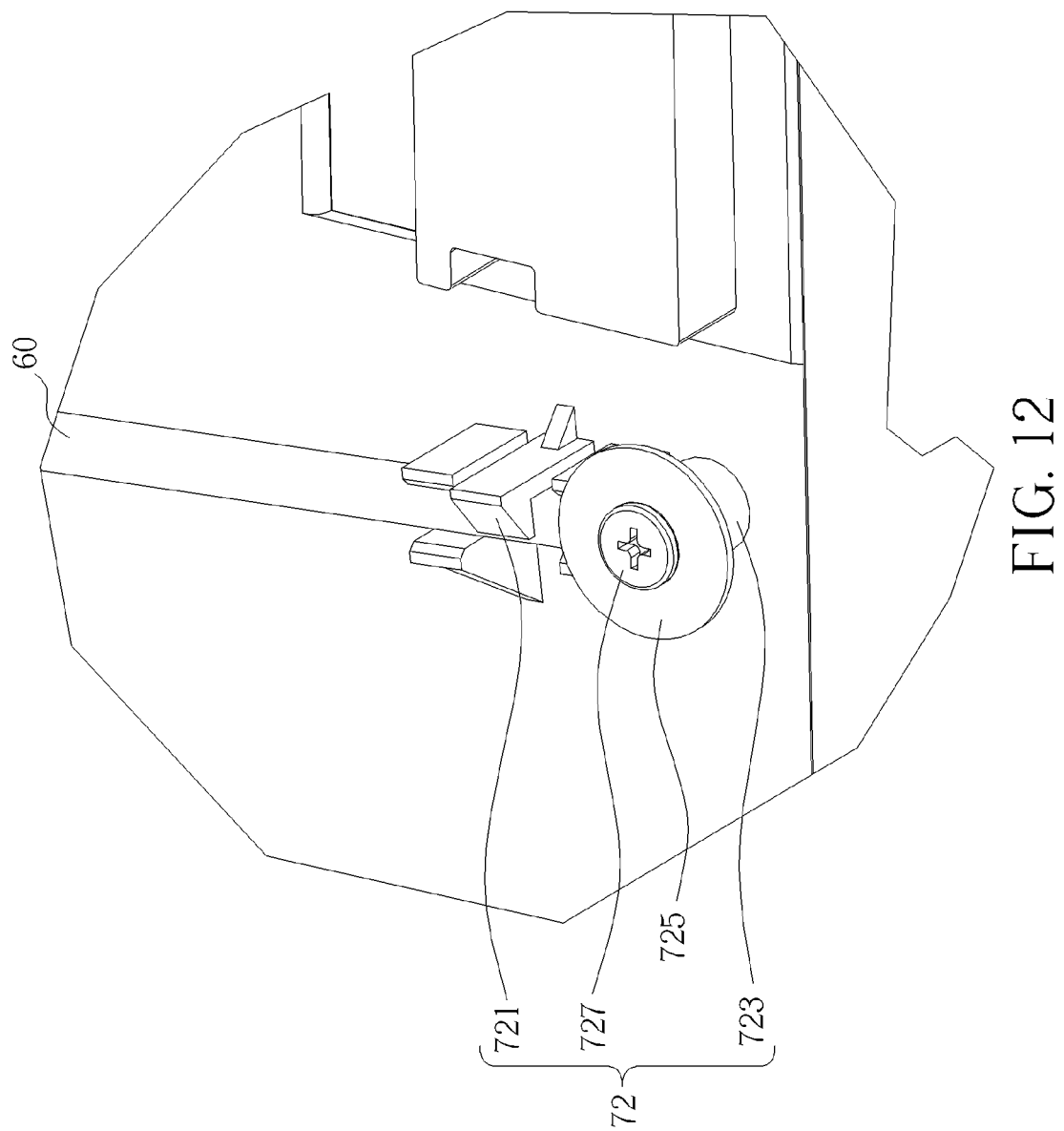
FIG. 12 is a partial enlarged view illustrating the second fixing structure according to an embodiment of the invention.

Furthermore, the guiding mechanism, 58 further comprises two first fixing structures 70 and two second fixing structures 72. Referring to FIGS. 4, 5 and 12, FIG. 12 is a partial enlarged view illustrating the second fixing structure 72 according to an embodiment of the invention. The two first fixing structures 70 are used for fixing an end of the first guiding component 60 and an end of the second guiding component 62, and the two second fixing structures 72 are used for fixing another end of the first guiding component 60 and another end of the second guiding component 62. Each of the first fixing structures 70 may be a fixing base, wherein the end of the first guiding component 60 and the end of the second guiding component 62 are inserted into the fixing bases correspondingly. Each of the second fixing structures 72 comprises a hook component 721, a fixing pillar 723, a washer 725 and a fixing member 727. When an operator wants to assemble the another end of the first guiding component 60 or the another end of the second guiding component 62 into the second fixing structure 72, he/she can press down the first guiding component 60 or the second guiding component 62 toward an oblique surface of the hook component 721 so as to deform the hook component 721 elastically. Then, when the another end of the first guiding component 60 or the another end of the second guiding component 62 departs from the oblique surface, the hook component 721 will recover to the original position due to elasticity so as to be engaged with the another end of the first guiding component 60 or the another end of the second guiding component 62. The washer 725 is disposed on the fixing pillar 723, and the fixing member 727 passes through the washer 725 and is fixed on the fixing pillar 723, such that the washer 725 presses down the another end of the first guiding component 60 or the another end of the second guiding component 62, so as to prevent the first guiding component 60 or the second guiding component 62 from lifting upwardly. The fixing pillar 723 and the fixing member 727 may be stud bolt and screw, respectively. The fixing structures for fixing the first guiding component 60 and the second guiding component 62 are not limited to the aforesaid embodiments and may be implemented by other fixing manners (e.g. hot melting, adhesion, etc.) based on practical applications. It should be noted that the second fixing structure 72 may comprise only one hook component 721 in another embodiment.

The operation principle of the guiding mechanism 58 of the invention will be depicted in detail in the following. Referring to FIGS. 1 to 3 and FIGS. 6 to 8, when the portable electronic device 50 is closed as shown in FIG. 1 or the display module 54 slides relative to the host module 52 in a reverse direction (e.g. the direction −X) of the first direction, the flexible printed circuit board 56 will pull the guiding portion 663 of the push rod sheath 66 in the reverse direction (e.g. the direction −X) of the first direction, so as to locate the push rod 64 and the push rod sheath 66 at a position close to the second fixing structure 72, as shown in FIG. 6. In this embodiment, the driving component 68 may be a compression spring. In other words, the driving component 68 will deform due to compression and extrusion when the display module 54 slides relative to the host module 52 in the direction −X. Accordingly, the driving component 68 is compressed under the state shown in FIGS. 1 and 6.

When the portable electronic device 50 is operated from the state shown in FIGS. 1 and 6 to the state shown in FIGS. 2 and 7 (i.e. the display module 54 slides relative to the host module 52 to the end in the first direction +X), the flexible printed circuit board 56 will get back and not pull the guiding portion 663 of the push rod sheath 63 anymore. Since the distance between the second guiding component 62 and the first guiding component 60 increases gradually, the driving component 68 will recover from the compression state to the original state gradually and then provide an elastic force for the rod base 643 of the push rod 64, so as to push the rod base 643 of the push rod 64 to move relative to the engaging portion 661 of the push rod sheath 66 in a second direction (e.g. the direction +Y), wherein the first direction +X may be substantially perpendicular to the second direction +Y. When the driving component 68 pushes the rod base 643 of the push rod 64 to move relative to the engaging portion 661 of the push rod sheath 66 in the second direction +Y, the push rod 64 and the push rod sheath 66 will be driven to move simultaneously relative to the first guiding component 60 and the second guiding component 62 in the first direction +X. Then, the guiding portion 663 of the push rod sheath 66 will push the flexible printed circuit board 56 to move, so as to prevent the flexible printed circuit board 56 from cracking due to compression and extrusion. When the portable electronic device 50 is operated from the state shown in FIGS. 2 and 7 to the state shown in FIGS. 3 and 8 (i.e. the display module 54 rotates upwardly relative to the host module 52), the flexible printed circuit board 56 will pull the guiding portion 663 of the push rod sheath 66 to move again in the direction −X. At this time, the rod base 643 of the push rod 64 will compress the driving component 68 again in a reverse direction (e.g. the direction −Y) of the second direction. Since the guiding mechanism 58 can guide the flexible printed circuit board 56 smoothly, the flexible printed circuit board 56 will not crack due to compression and extrusion when the display module 54 slides or rotates relative to the host module 52. It should be noted that the principle of how to operate the portable electronic device 50 from the state shown in FIGS. 3 and 8 to the state shown in FIGS. 1 and 6 through the state shown in FIGS. 2 and 7 is substantially the same as mentioned in the above, so it will not be depicted herein again.

Figure 13:
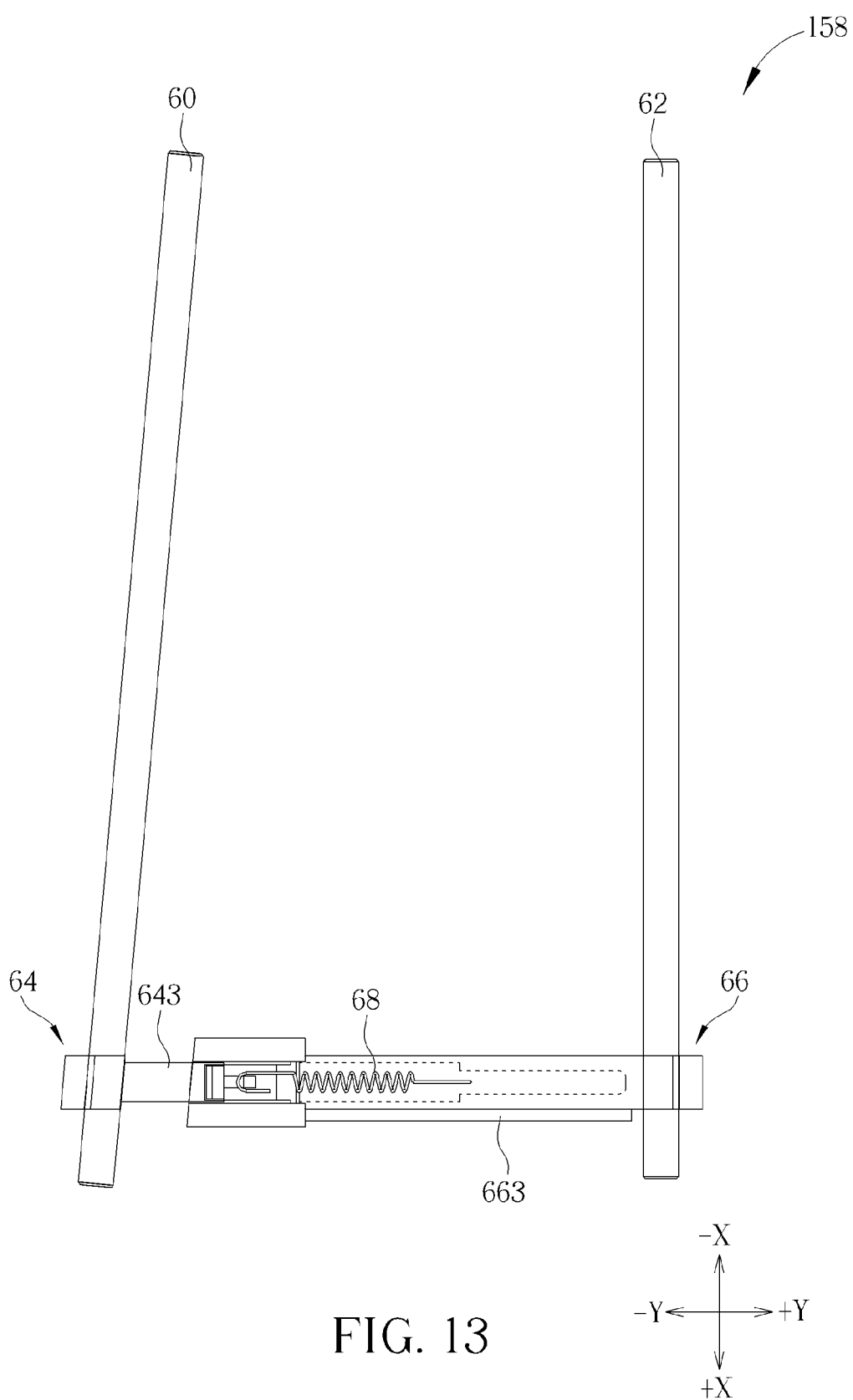
FIG. 13 is a schematic diagram illustrating parts of a guiding mechanism according to another embodiment of the invention.
Figure 14:
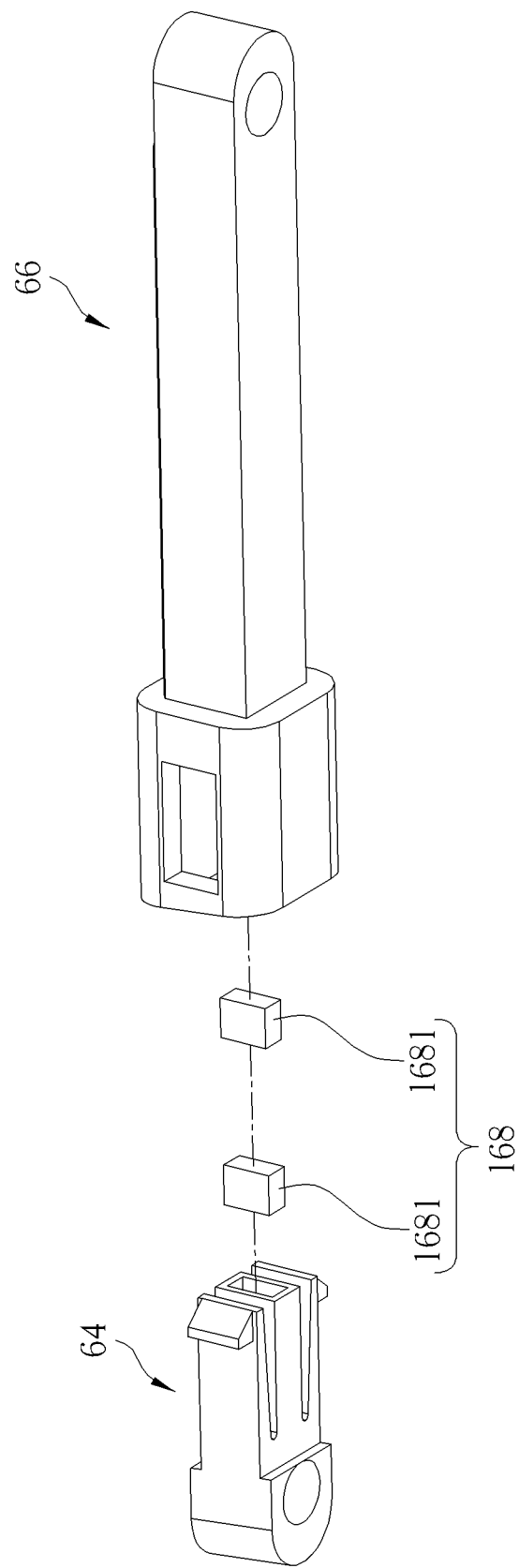
FIG. 14 is an exploded view illustrating a driving component, a push rod and a push rod sheath according to another embodiment of the invention.

Still further, the resilient component of the invention may be also an extension spring. Referring to FIG. 13, FIG. 13 is a schematic diagram illustrating parts of a guiding mechanism 158 according to another embodiment of the invention. In this embodiment, the distance between the second guiding component 62 and the first guiding component 60 increases gradually in the direction +X. When the display module 54 slides relative to the host module 52 in the direction +X, the driving component 68 will deform due to extension and the flexible printed circuit board 56 can pull the guiding portion 663 of the push rod sheath 66 to move in the direction +X. On the other hand, when the display module 54 slides relative to the host module 52 in the direction −X, the driving component 68 will provide an elastic force for the rod base 643 of the push rod 64, so as to pull the rod base 643 of the push rod 64 to move relative to the engaging portion 661 of the push rod sheath 66 in the direction +Y. When the driving component 68 pulls the rod base 643 of the push rod 64 to move relative to the engaging portion 661 of the push rod sheath 66 in the direction +Y, the push rod 64 and the push rod sheath 66 will be driven to slide relative to the first guiding component 60 and the second guiding component 62 in the direction −X, such that the guiding portion 663 of the push rod sheath 66 pushes the flexible printed circuit board 56 to move. The other operation principles are substantially the same as the aforesaid embodiments and will not be depicted herein again.

It should be noted that the driving component of the invention may be also implemented by, for example, one set of magnetic components except the compression spring or the extension spring. That is to say, the invention may utilize attractive or repulsive force generated between at least two magnetic units of the set of magnetic components to achieve the same effect of the compression spring or the extension spring mentioned in the aforesaid embodiments. Referring to FIGS. 5-8 and 14, FIG. 14 is an exploded view illustrating a driving component 168, a push rod 64 and a push rod sheath 66 according to another embodiment of the invention. The driving component 168 may comprise at least two magnetic units 1681 disposed on the push rod 64 and the push rod sheath 66, respectively. The driving component 168 may be operated with the operation principle of the aforesaid embodiments shown in FIGS. 5 to 8. For example, the two magnetic units 1681 of the invention may repel each other when the display module 54 slides relative to the host module 52 in the direction +X, so as to drive the rod base 643 of the push rod 64 to move relative to the engaging portion 661 of the push rod sheath 66 in the direction +Y. When the two magnetic units 1681 drive the rod base 643 of the push rod 64 to move relative to the engaging portion 661 of the push rod sheath 66 in the direction +Y, the push rod 64 and the push rod sheath 66 will be driven to slide relative to the first guiding component 60 and the second guiding component 62 in the direction +X such that the guiding portion 663 of the push rod sheath 66 pushes the flexible printed circuit board 56 to move. On the other hand, when the display module 54 slides relative to the host module 52 in the direction −X, the flexible printed circuit board 56 will pull the guiding portion 663 of the push rod sheath 66 to move in the direction −X. The other operation principles are substantially the same as the aforesaid embodiments and will not be depicted herein again. Furthermore, the driving component 168 may be also operated with the operation principle of the aforesaid embodiments shown in FIG. 13. For example, the two magnetic units 1681 of the invention may attract each other when the display module 54 slides relative to the host module 52 in the direction −X, so as to drive the rod base 643 of the push rod 64 to move relative to the engaging portion 661 of the push rod sheath 66 in the direction +Y. When the two magnetic units 1681 drive the rod base 643 of the push rod 64 to move relative to the engaging portion 661 of the push rod sheath 66 in the direction +Y, the push rod 64 and the push rod sheath 66 will be driven to slide relative to the first guiding component 60 and the second guiding component 62 in the direction −X such that the guiding portion 663 of the push rod sheath 66 pushes the flexible printed circuit board 56 to move. On the other hand, when the display module 54 slides relative to the host module 52 in the direction +X, the flexible printed circuit board 56 will pull the guiding portion 663 of the push rod sheath 66 to move in the direction +X. The other operation principles are substantially the same as the aforesaid embodiments and will not be depicted herein again. Therefore, as mentioned in the above, the scope of the invention comprises any mechanisms capable of driving the push rod 64 and the push rod sheath 66 to move relatively.

Figure 15:
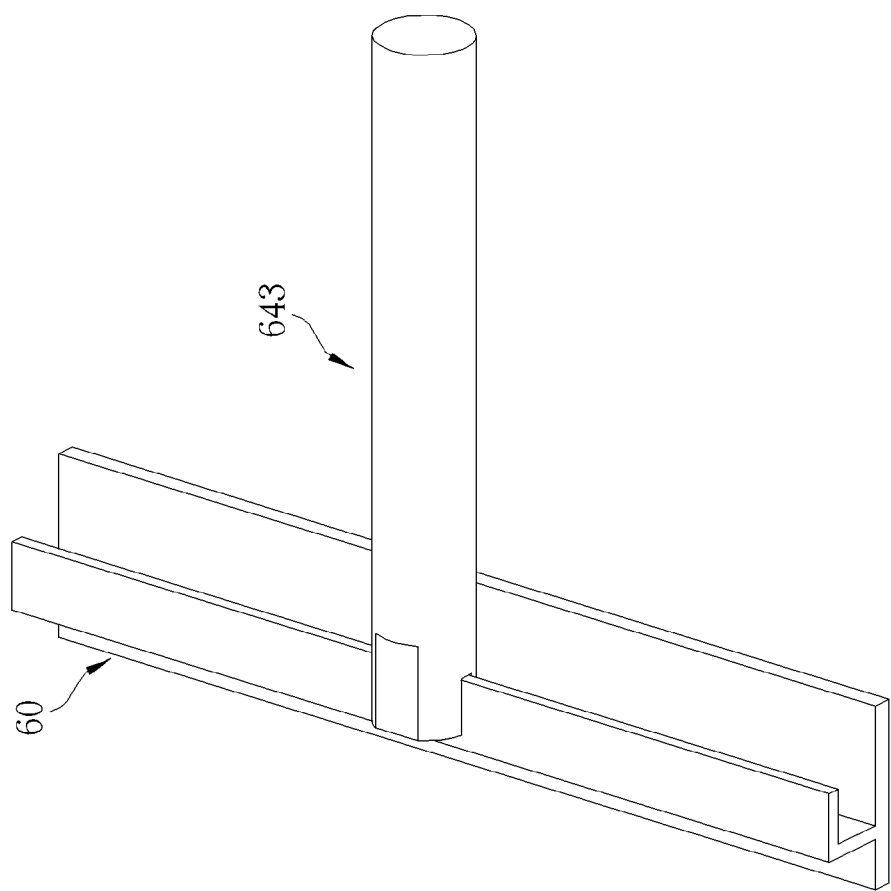
FIGS. 15 and 16 are schematic diagrams illustrating the connection between the rod base of the push rod and the first guiding component according to other embodiments of the invention.
Figure 16:
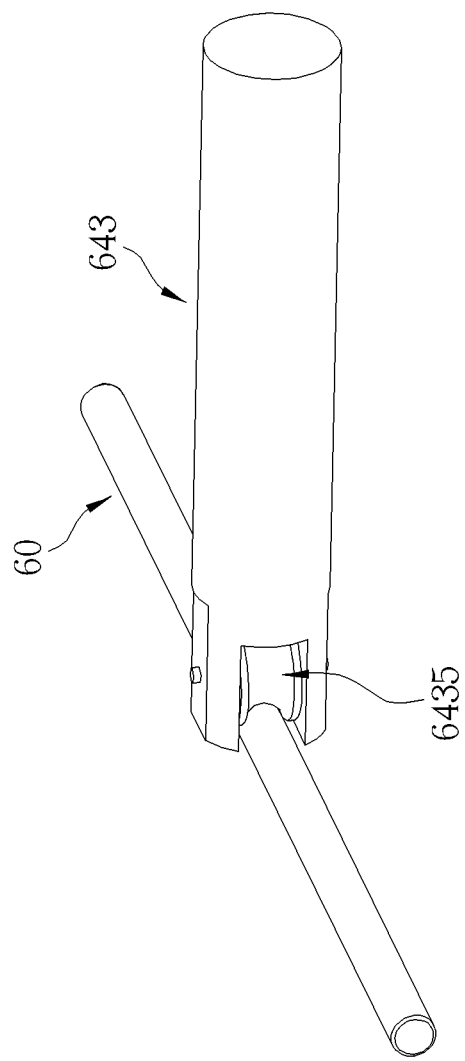

Moreover, the connection between the push rod 64, the push rod sheath 66, the first guiding component 60 and the second guiding component 62 is not limited to the aforesaid embodiments. The connection between the push rod 64 and the first guiding component 60 is depicted in the following by other embodiments. Referring to FIGS. 15 and 16, FIGS. 15 and 16 are schematic diagrams illustrating the connection between the rod base 643 of the push rod 64 and the first guiding component 60 according to other embodiments of the invention. As shown in FIG. 15, the first guiding component 60 may be designed as a guiding track and an engaging groove may be formed on another end of the rod base 643 correspondingly, wherein the engaging groove is slidably engaged with the guiding track such that the rod base 643 is slidably connected to the first guiding component 60. Similarly, the second guiding component 62 may be designed as a guiding track and an engaging groove may be formed on another end of the guiding portion 663 of the push rod sheath 66 correspondingly, wherein the engaging groove is slidably engaged with the guiding track such that the guiding portion 663 is slidably connected to the second guiding component 62. Still further, as shown in FIG. 16, the first guiding component 60 may be designed as a guiding rod and a roller 6435 maybe disposed on another end of the rod base 643 correspondingly, wherein the roller 6435 is rotatably connected to the guiding rod such that the rod base 643 is slidably connected to the first guiding component 60. Similarly, the second guiding component 62 may be designed as a guiding rod and a roller may be disposed on another end of the guiding portion 663 of the push rod sheath 66 correspondingly, wherein the roller is rotatably connected to the guiding rod such that the guiding portion 663 is slidably connected to the second guiding component 62. Therefore, as mentioned in the above, the scope of the invention comprises any structural designs for connecting the push rod 64 and the push rod sheath 66 with the first guiding component 60 and the second guiding component 62 in a slidable manner.

Compared with the prior art, the guiding mechanism of the invention can guide the flexible printed circuit board smoothly. Therefore, when the display module slides or rotates relative to the host module repeatedly, the flexible printed circuit board will not crack due to compression and extrusion such that the stability of the flexible printed circuit board can be improved effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A guiding mechanism for guiding a flexible printed circuit board connected with a display module and a host module, comprising:
   a first guiding component;
   a second guiding component, a distance being between the second guiding component and the first guiding component and increasing in a first direction;
   a push rod disposed between the first guiding component and the second guiding component, the push rod comprising:
      a rod base slidably connected to the first guiding component;
   a push rod sheath disposed between the first guiding component and the second guiding component, the push rod sheath comprising:
      an engaging portion movably engaged with the rod base; and
      a guiding portion, an end of the guiding portion being connected to the engaging portion, another end of the guiding portion being slidably connected to the second guiding component, the guiding portion being used for pushing the flexible printed circuit board; and a driving component disposed in the guiding portion of the push rod sheath, the driving component driving the rod base of the push rod to move relative to the engaging portion of the push rod sheath when the display module slides relative to the host module, so as to drive the push rod and the push rod sheath to slide relative to the first guiding component and the second guiding component such that the guiding portion of the push rod sheath pushes the flexible printed circuit board to move.

2. The guiding mechanism of claim 1, wherein the first guiding component and the second guiding component are guiding rods, the guiding mechanism further comprises two first fixing structures and two second fixing structures, the two first fixing structures are used for fixing an end of the first guiding component and an end of the second guiding component, the two second fixing structures are used for fixing another end of the first guiding component and another end of the second guiding component.

3. The guiding mechanism of claim 2, wherein each of the first fixing structures is a fixing base, each of the second fixing structures comprises a hook component for engaging the another end of the first guiding component and the another end of the second guiding component.

4. The guiding mechanism of claim 2, wherein each of the second fixing structures comprises a fixing pillar, a washer and a fixing member, the washer is disposed on the fixing pillar, the fixing member passes through the washer and is fixed on the fixing pillar such that the washer presses down the another end of the first guiding component and the another end of the second guiding component.

5. The guiding mechanism of claim 1, wherein an end of the rod base and an end of the guiding portion have axial holes formed thereon, the rod base and the guiding portion are sleeved on the first guiding component and the second guiding component through the axial holes.

6. The guiding mechanism of claim 1, wherein the end of the rod base has at least one hook, the engaging portion has at least one engaging groove formed thereon, the at least one hook is movably engaged with the at least one engaging groove.

7. The guiding mechanism of claim 1, wherein a side of the guiding portion has a curved structure formed thereon and abutting against the flexible printed circuit board.

8. The guiding mechanism of claim 1, wherein the push rod further comprises a rod body, an end of the push rod is connected to the rod body, another end of the push rod is slidably connected to the first guiding component, the driving component is a resilient component sleeved on the rod body of the push rod.

9. The guiding mechanism of claim 8, wherein the guiding portion has a rod body groove and a resilient component groove formed therein, the rod body groove and the resilient component groove communicate with each other and are used for accommodating the rod body of the push rod and the resilient component.

10. The guiding mechanism of claim 8, wherein the resilient component is a compression spring, the compression spring deforms when the display module slides relative to the host module in a reverse direction of the first direction and provides an elastic force for the rod base of the push rod when the display module slides relative to the host module in the first direction, so as to push the rod base of the push rod to move relative to the engaging portion of the push rod sheath in a second direction, the first direction is substantially perpendicular to the second direction.

11. The guiding mechanism of claim 10, wherein the resilient component pushes the rod base of the push rod to move relative to the engaging portion of the push rod sheath in the second direction, so as to drive the push rod and the push rod sheath to slide relative to the first guiding component and the second guiding component in the first direction such that the guiding portion of the push rod sheath pushes the flexible printed circuit board to move.

12. The guiding mechanism of claim 10, wherein when the display module slides relative to the host module in the reverse direction of the first direction, the flexible printed circuit board pulls the guiding portion of the push rod sheath to move in the reverse direction of the first direction.

13. The guiding mechanism of claim 8, wherein the resilient component is an extension spring, the extension spring deforms when the display module slides relative to the host module in the first direction and provides an elastic force for the rod base of the push rod when the display module slides relative to the host module in a reverse direction of the first direction, so as to pull the rod base of the push rod to move relative to the engaging portion of the push rod sheath in a second direction, the first direction is substantially perpendicular to the second direction.

14. The guiding mechanism of claim 13, wherein the resilient component pulls the rod base of the push rod to move relative to the engaging portion of the push rod sheath in the second direction, so as to drive the push rod and the push rod sheath to slide relative to the first guiding component and the second guiding component in the reverse direction of the first direction such that the guiding portion of the push rod sheath pushes the flexible printed circuit board to move.

15. The guiding mechanism of claim 13, wherein when the display module slides relative to the host module in the first direction, the flexible printed circuit board pulls the guiding portion of the push rod sheath to move in the first direction.

16. The guiding mechanism of claim 1, wherein the driving component comprises two magnetic units disposed on the push rod and the push rod sheath, the two magnetic units repel each other when the display module slides relative to the host module in the first direction, so as to push the rod base of the push rod to move relative to the engaging portion of the push rod sheath in a second direction, the first direction is substantially perpendicular to the second direction.

17. The guiding mechanism of claim 16, wherein the two magnetic units drives the rod base of the push rod to move relative to the engaging portion of the push rod sheath in the second direction, so as to drive the push rod and the push rod sheath to slide relative to the first guiding component and the second guiding component in the first direction such that the guiding portion of the push rod sheath pushes the flexible printed circuit board to move.

18. The guiding mechanism of claim 16, wherein when the display module slides relative to the host module in a reverse direction of the first direction, the flexible printed circuit board pulls the guiding portion of the push rod sheath to move in the reverse direction of the first direction.

19. The guiding mechanism of claim 1, wherein the driving component comprises two magnetic units disposed on the push rod and the push rod sheath, the two magnetic units attract each other when the display module slides relative to the host module in a reverse direction of the first direction, so as to pull the rod base of the push rod to move relative to the engaging portion of the push rod sheath in a second direction, the first direction is substantially perpendicular to the second direction.

20. The guiding mechanism of claim 19, wherein the two magnetic units drives the rod base of the push rod to move relative to the engaging portion of the push rod sheath in the second direction, so as to drive the push rod and the push rod sheath to slide relative to the first guiding component and the second guiding component in the reverse direction of the first direction such that the guiding portion of the push rod sheath pushes the flexible printed circuit board to move.

21. The guiding mechanism of claim 19, wherein when the display module slides relative to the host module in the first direction, the flexible printed circuit board pulls the guiding portion of the push rod sheath to move in the first direction.

22. The guiding mechanism of claim 1, wherein the first guiding component or the second guiding component is a guiding track, an engaging groove corresponding to the guiding track is formed on an end of the rod base or an end of the guiding portion, the engaging groove is slidably engaged with the guiding track.

23. The guiding mechanism of claim 1, wherein the first guiding component or the second guiding component is a guiding rod, a roller corresponding to the guiding rod is disposed on an end of the rod base or an end of the guiding portion, the roller is rotatably connected to the guiding rod.

24. A portable electronic device comprising:
a host module;
a display module slidably disposed on a side of the host module;
a flexible printed circuit board connected with the host module and the display module; and
a guiding mechanism for guiding the flexible printed circuit board, the guiding mechanism comprising:
a first guiding component;
a second guiding component, a distance being between the second guiding component and the first guiding component and increasing in a first direction;
a push rod disposed between the first guiding component and the second guiding component, the push rod comprising:
a rod base slidably connected to the first guiding component;
a push rod sheath disposed between the first guiding component and the second guiding component, the push rod sheath comprising:
an engaging portion movably engaged with the rod base; and
a guiding portion, an end of the guiding portion being connected to the engaging portion, another end of the guiding portion being slidably connected to the second guiding component, the guiding portion being used for pushing the flexible printed circuit board; and
a driving component disposed in the guiding portion of the push rod sheath, the driving component driving the rod base of the push rod to move relative to the engaging portion of the push rod sheath when the display module slides relative to the host module, so as to drive the push rod and the push rod sheath to slide relative to the first guiding component and the second guiding component such that the guiding portion of the push rod sheath pushes the flexible printed circuit board to move.

25. The portable electronic device of claim 24, wherein the push rod further comprises a rod body, an end of the push rod is connected to the rod body, another end of the push rod is slidably connected to the first guiding component, the driving component is a resilient component sleeved on the rod body of the push rod.

26. The portable electronic device of claim 25, wherein the resilient component is a compression spring, the compression spring deforms when the display module slides relative to the host module in a reverse direction of the first direction and provides an elastic force for the rod base of the push rod when the display module slides relative to the host module in the first direction, so as to push the rod base of the push rod to move relative to the engaging portion of the push rod sheath in a second direction, the first direction is substantially perpendicular to the second direction.

27. The portable electronic device of claim 26, wherein the resilient component pushes the rod base of the push rod to move relative to the engaging portion of the push rod sheath in the second direction, so as to drive the push rod and the push rod sheath to slide relative to the first guiding component and the second guiding component in the first direction such that the guiding portion of the push rod sheath pushes the flexible printed circuit board to move.

28. The portable electronic device of claim 26, wherein when the display module slides relative to the host module in the reverse direction of the first direction, the flexible printed circuit board pulls the guiding portion of the push rod sheath to move in the reverse direction of the first direction.

29. The portable electronic device of claim 25, wherein the resilient component is an extension spring, the extension spring deforms when the display module slides relative to the host module in the first direction and provides an elastic force for the rod base of the push rod when the display module slides relative to the host module in a reverse direction of the first direction, so as to pull the rod base of the push rod to move relative to the engaging portion of the push rod sheath in a second direction, the first direction is substantially perpendicular to the second direction.

30. The portable electronic device of claim 29, wherein the resilient component pulls the rod base of the push rod to move relative to the engaging portion of the push rod sheath in the second direction, so as to drive the push rod and the push rod sheath to slide relative to the first guiding component and the second guiding component in the reverse direction of the first direction such that the guiding portion of the push rod sheath pushes the flexible printed circuit board to move.

31. The portable electronic device of claim 29, wherein when the display module slides relative to the host module in the first direction, the flexible printed circuit board pulls the guiding portion of the push rod sheath to move in the first direction.

32. The portable electronic device of claim 24, wherein the driving component comprises two magnetic units disposed on the push rod and the push rod sheath, the two magnetic units repel each other when the display module slides relative to the host module in the first direction, so as to push the rod base of the push rod to move relative to the engaging portion of the push rod sheath in a second direction, the first direction is substantially perpendicular to the second direction.

33. The portable electronic device of claim 32, wherein the two magnetic units drives the rod base of the push rod to move relative to the engaging portion of the push rod sheath in the second direction, so as to drive the push rod and the push rod sheath to slide relative to the first guiding component and the second guiding component in the first direction such that the guiding portion of the push rod sheath pushes the flexible printed circuit board to move.

34. The portable electronic device of claim 32, wherein when the display module slides relative to the host module in a reverse direction of the first direction, the flexible printed circuit board pulls the guiding portion of the push rod sheath to move in the reverse direction of the first direction.

35. The portable electronic device of claim 24, wherein the driving component comprises two magnetic units disposed on the push rod and the push rod sheath, the two magnetic units attract each other when the display module slides relative to the host module in a reverse direction of the first direction, so as to pull the rod base of the push rod to move relative to the engaging portion of the push rod sheath in a second direction, the first direction is substantially perpendicular to the second direction.

36. The portable electronic device of claim 35, wherein the two magnetic units drives the rod base of the push rod to move relative to the engaging portion of the push rod sheath in the second direction, so as to drive the push rod and the push rod sheath to slide relative to the first guiding component and the second guiding component in the reverse direction of the first direction such that the guiding portion of the push rod sheath pushes the flexible printed circuit board to move.

37. The portable electronic device of claim 35, wherein when the display module slides relative to the host module in the first direction, the flexible printed circuit board pulls the guiding portion of the push rod sheath to move in the first direction.

\* \* \* \* \*